(12) United States Patent
Park et al.

(10) Patent No.: US 9,589,077 B2
(45) Date of Patent: Mar. 7, 2017

(54) METHOD FOR DESIGNING LENS OF LIGHTING DEVICE

(71) Applicant: LG Electronics Inc., Seoul (KR)

(72) Inventors: Sunjung Park, Seoul (KR); Chunji Hong, Seoul (KR); Junwon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 68 days.

(21) Appl. No.: 14/744,714

(22) Filed: Jun. 19, 2015

(65) Prior Publication Data

US 2015/0370925 A1    Dec. 24, 2015

(30) Foreign Application Priority Data

Jun. 20, 2014   (KR) .................. 10-2014-0075963

(51) Int. Cl.
| | | |
|---|---|---|
| G06F 17/50 | (2006.01) | |
| F21V 5/04 | (2006.01) | |
| F21S 8/08 | (2006.01) | |
| G02B 3/00 | (2006.01) | |
| F21W 131/103 | (2006.01) | |
| F21Y 101/00 | (2016.01) | |

(52) U.S. Cl.
CPC .............. *G06F 17/50* (2013.01); *F21S 8/085* (2013.01); *F21V 5/04* (2013.01); *G02B 3/00* (2013.01);

(Continued)

(58) Field of Classification Search
CPC . G06F 17/50; F21S 8/085; F21S 8/086; F21S 8/088; F21V 5/04; F21V 5/00;
(Continued)

(56) References Cited

U.S. PATENT DOCUMENTS 7,798,679 B2 *   9/2010   Kokubo ............. G02B 19/0014
                                                    362/334
8,136,967 B2 *   3/2012   Weaver .................... F21V 3/04
                                                    362/298

(Continued)

FOREIGN PATENT DOCUMENTS

KR     10-1263491 B1     5/2001
KR     10-0935205 B1    12/2009
(Continued)

*Primary Examiner* — Bao Q Truong
(74) *Attorney, Agent, or Firm* — Birch, Stewart, Kolasch & Birch, LLP

(57) ABSTRACT

A method for designing a lens of a lighting device having a first spherical surface refracting light generated from an LED device that is a light source and a second spherical surface refracting the light passing through the first spherical surface includes determining an irradiation surface that is an area onto which light passing through the second spherical surface is irradiated, forming a reference circle disposed within the irradiation surface; designing a free curved surface of the first spherical surface by using light emitted from the LED device as an input direction vector and a coordinate within the reference circle as an output direction vector to calculate normal vectors, and designing a free curved surface of the second spherical surface by using light refracted by the first spherical surface as an input direction vector and a coordinate within the irradiation surface as an output direction vector to calculate normal vectors.

13 Claims, 11 Drawing Sheets

(52) U.S. Cl.
CPC .... *F21W 2131/103* (2013.01); *F21Y 2101/00* (2013.01); *Y10T 29/4976* (2015.01)

(58) Field of Classification Search
CPC . F21V 5/048; F21V 5/08; F21V 99/00; G02B 3/00; G02B 3/0037; G02B 2003/0093; Y10T 29/4976; F21W 2131/103; F21Y 2101/00; F21K 9/50
See application file for complete search history.

(56) References Cited

U.S. PATENT DOCUMENTS

| | | | |
|---|---|---|---|
| 9,206,955 B2* | 12/2015 | Yu | F21V 5/04 |
| 2011/0320024 A1* | 12/2011 | Lin | F21V 5/04 |
| | | | 700/98 |
| 2012/0039077 A1* | 2/2012 | Householder | G02B 17/086 |
| | | | 362/308 |
| 2013/0083288 A1* | 4/2013 | Shinohara | G02C 7/02 |
| | | | 351/159.42 |
| 2014/0320781 A1* | 10/2014 | Park | G02F 1/133603 |
| | | | 349/61 |
| 2015/0192256 A1 | 7/2015 | Hyun et al. | |
| 2016/0201876 A1* | 7/2016 | Lv | F21V 5/008 |
| | | | 362/268 |

FOREIGN PATENT DOCUMENTS

| | | |
|---|---|---|
| KR | 10-1320869 B1 | 10/2013 |
| KR | 10-1343563 B1 | 12/2013 |

* cited by examiner

BACKGROUND ART

BACKGROUND ART

BACKGROUND ART

METHOD FOR DESIGNING LENS OF LIGHTING DEVICE

CROSS-REFERENCE TO RELATED APPLICATIONS

The present application claims priority under 35 U.S.C. 119 to Korean Patent Application No. 10-2014-0075963, filed Jun. 20, 2014, which is hereby incorporated by reference in its entirety.

BACKGROUND

The present disclosure relates to a method for designing a lens of a lighting device, and more particularly, to a method for designing a lens that is capable of determining a light irradiation area of a lighting device to refract light toward the determined irradiation area.

Recently, LEDs have been increasingly adopted as light sources to save energy in many industries including lighting devices. Accordingly, studies for effectively and efficiently using LEDs in industrial fields are being actively conducted.

However, the LED light source has a property of light travelling in a straight line. Thus, as illustrated in FIG. 1, an emission shape of light energy of an LED that is similar to a point light source has a light distribution characteristic in which light is concentrated into a central portion rather than surrounding portions. To supplement a dazzling phenomenon due to the light concentration and drawbacks of the pollution, optical lenses for diffusing and adjusting the LED light distribution are being developed.

Also, a lighting device using the LED as a light source has to be designed so that a light irradiation area changes according to an installed position of the lighting device. For example, it is necessary to design the lighting device so that an irradiation area (i.e., an irradiation surface) of light emitted from the LED changes according to installation places and purposes, such as locations of general streetlamps, security lights, and lights for tunnels.

Also, it is required to efficiently design and install lighting devices so that irradiation surfaces between the lighting devices adjacent to each other do not overlap each other.

SUMMARY

Embodiments provide a method for easily designing a lens for refracting LED light according to a required irradiation surface. That is, if it is intended to differently determine irradiation surfaces according to an installed position and purpose, a method for easily designing a lens, based on the required irradiation surface, is suggested.

Embodiments also provide a method for designing a lens by using a required irradiation surface to efficiently use light emitted from each lighting device.

In one embodiment, a method for designing a lens having a first spherical surface refracting light generated from an LED device that is a light source and a second spherical surface refracting the light passing through the first spherical surface in a lighting device, the method includes: determining an irradiation surface that is an area onto which light passing through the second spherical surface is irradiated; forming a reference circle disposed within the irradiation surface; designing a free curved surface of the first spherical surface by using light emitted from the LED device as an input direction vector and a coordinate within the reference circle as an output direction vector to calculate normal vectors; and designing a free curved surface of the second spherical surface by using light refracted by the first spherical surface as an input direction vector and a coordinate within the irradiation surface as an output direction vector to calculate normal vectors.

Determining an irradiation surface may use a superellipse equation that is capable of calculating x and y coordinates constituting a determined shape.

The designing of the free curved surface of the first spherical surface may use Snell's law that is expressed in Mathematical Equation 2 discussed hereinafter. The input direction vector $\vec{In}$ may be a direction vector of light emitted from the LED device, and the output direction vector $\vec{Out}$ may be a direction vector of x and y coordinates disposed within the reference circle.

The designing of the free curved surface of the second spherical surface may use Snell's law that is expressed in Mathematical Equation 2 discussed hereinafter. The input direction vector $\vec{In}$ may be a direction vector of x and y coordinates disposed within the reference circle, and the output direction vector $\vec{Out}$ may be a direction vector of x and y coordinates disposed within the irradiation surface.

DETAILED DESCRIPTION OF THE EMBODIMENTS

Hereinafter, a method for designing a lens for refracting light emitted from a light source of a lighting device according to an embodiment will be described in detail.

According to an embodiment, a superellipse equation used for designing a spherical surface of a lens will be described.

Figure 1:
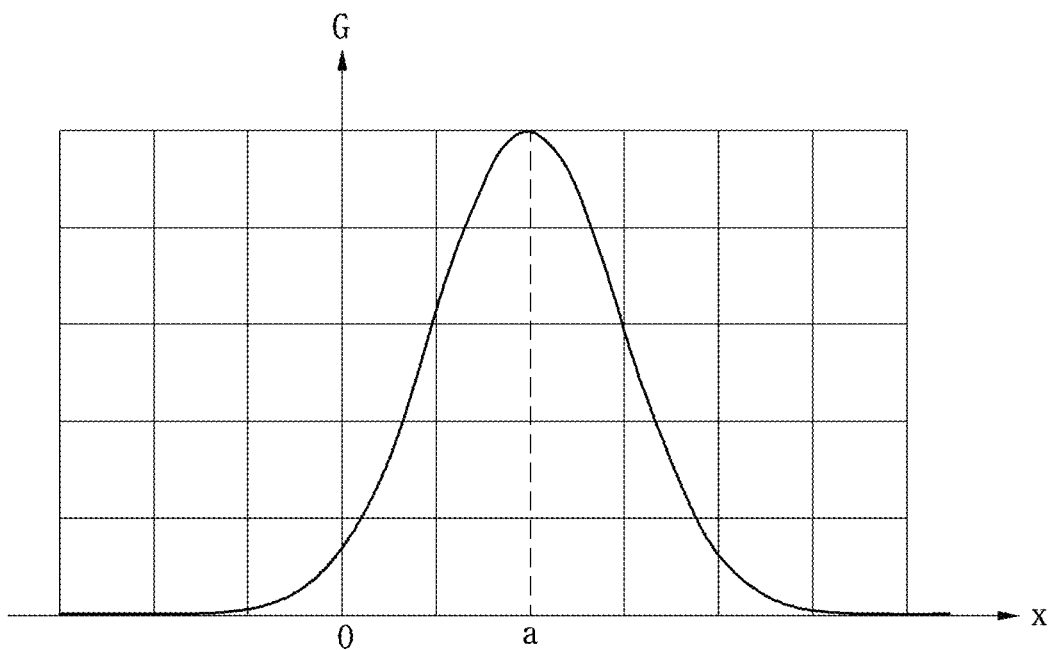
FIG. 1 is a graph illustrating an emission shape of general light energy in an LED light source.
Figure 2:
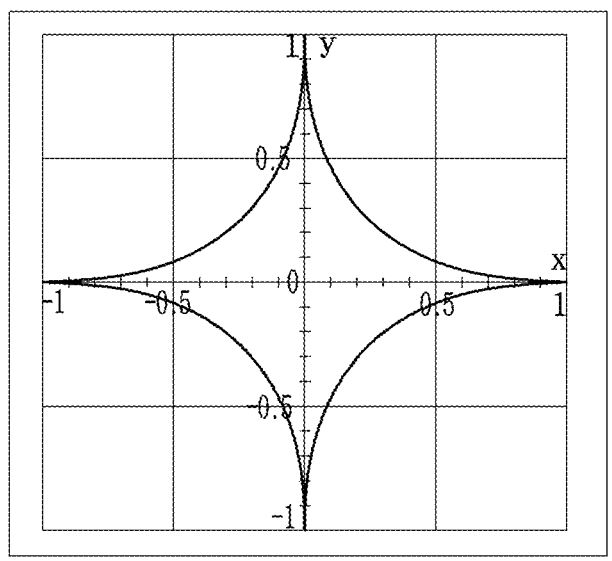
FIGS. 2 to 4 are graphs illustrating an example of a shape of a curve that is capable of being calculated through a superellipse equation.
Figure 3:
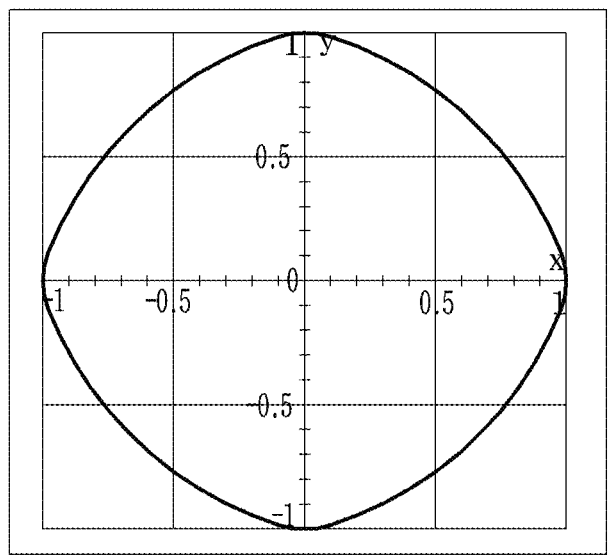

FIGS. 2 to 3 are graphs illustrating an example of a shape of a curve that is calculated through the superellipse equation.

The superellipse equation is expressed as Mathematical Equation 1 below.

$$\left|\frac{x}{a}\right|^n + \left|\frac{y}{b}\right|^n = 1 \qquad \text{[Mathematical Equation 1]}$$

When n, a, and b are positive numbers, and x and y satisfy the following range: −a≤x≤+a, −b≤y≤+b, a closed formula is defined within a rectangular shape.

When n is defined between 0 and 1, a superellipse has a curve having a concave shape, particularly, when n is equal to 0.5, as illustrated in FIG. 2, each of all the four arcs may be defined as a secondary Bezier curve. That is, each of the arcs has a parabolic shape.

The curve has a diamond shape when n is equal to 1 and has a diamond shape of which each of the corners has a convex shape when n is defined between 1 and 2. Here, the radius of curvature continuously increases without being limited. For reference, the curve has a general oval when n is equal to 2 and a circle having the same radius when a is equal to b. Also, when n is greater than 2, each of the corners has a rounded rectangular shape in appearance.

Figure 4:
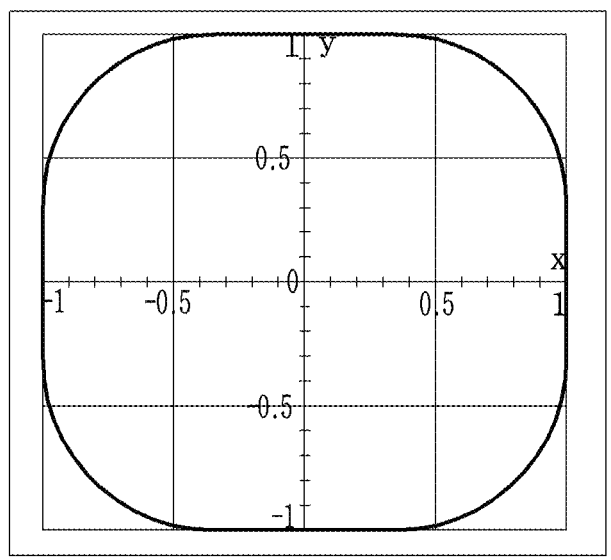

In FIG. 3, a curve shape is illustrated when n is equal to 1.5 and each of a and b are equal to 1. As illustrated in FIG. 4, a rectangular shape is illustrated when n is equal to 4 and each of a and b are equal to 1.

As a result, a light distribution shape of the lighting device may be determined by adjusting the n value in the superellipse equation. For example, an irradiation surface of a lighting device may be set to have a special light distribution shape including a circle, a rectangle, an asymmetric shape, or a cross shape.

The irradiation surface may have a shape determined by adjusting a variable in the superellipse equation. In detail, a and b values in the superellipse equation may be adjusted to determine a shape of a curve forming the irradiation surface. For example, an area to be irradiated may have a rectangular shape such as a rectangle or square through the adjustment of the variable.

When the values of a, b, and n are determined through the superellipse equation to determine the irradiation surface of the lighting device, x and y coordinates constituting a curve in the determined irradiation surface may be achieved. In the current embodiment, the irradiation surface of the lighting device using the superellipse equation may be determined, and then x and y coordinates constituting a curve acquired by the determined irradiation surface may be obtained.

Final x and y coordinates to which light is irradiated are calculated through the superellipse equation, and then an outer surface of a lens, i.e., a second spherical surface, may be designed through the calculated coordinates.

It brings many advantages that a final shape of the light distribution, i.e., the irradiation surface is determined, and then a lens for refracting light into the determined irradiation surface, is designed. For example, an amount of light irradiated to an unnecessary area may decrease to concentrate the light distribution to a desired area.

Figure 5:
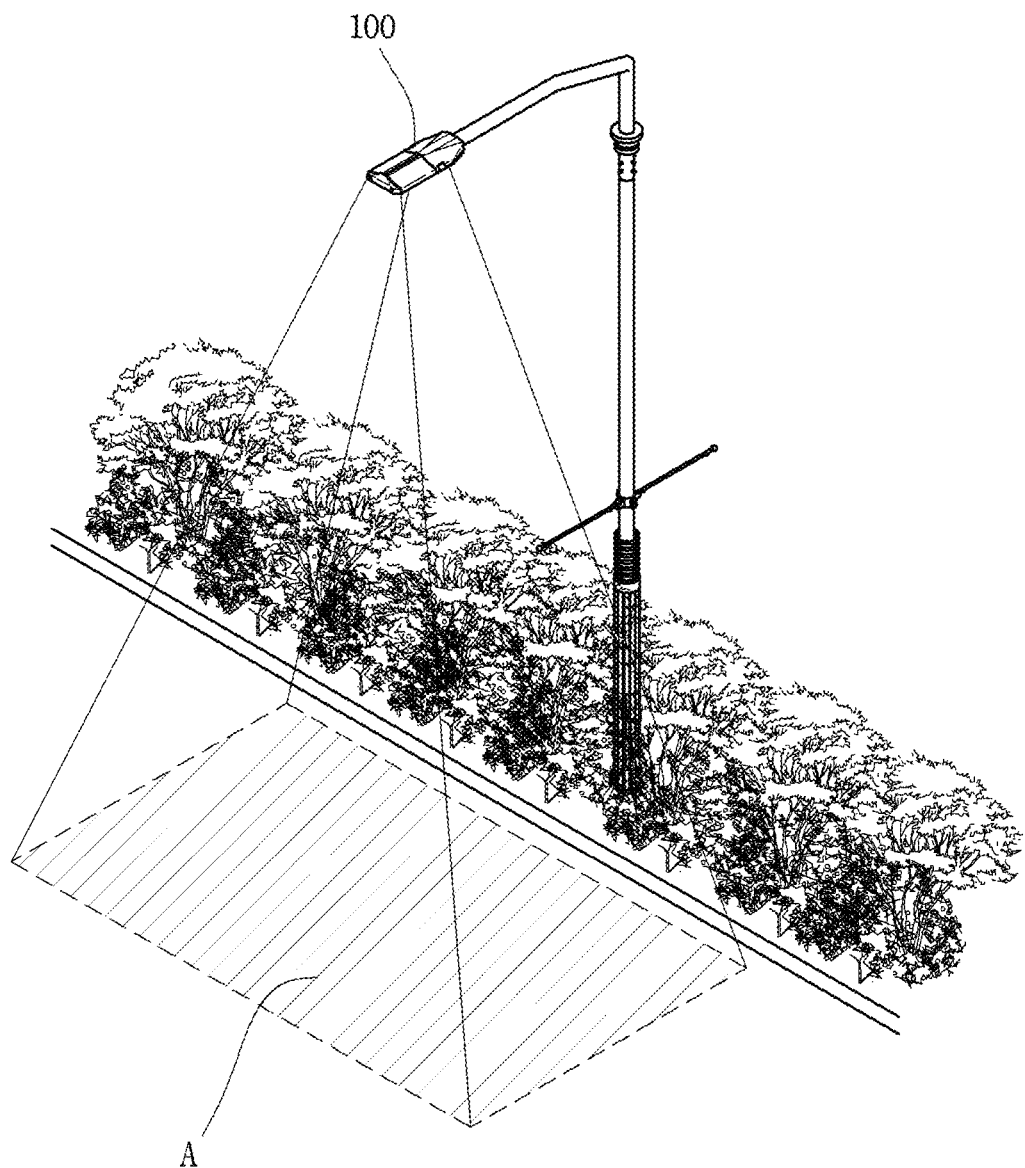
FIG. 5 is a view illustrating an example of a lighting device disposed adjacent to a road and an irradiation surface of the lighting device.

FIG. 5 is a view illustrating a lighting device 100 as an example of the lighting device and an irradiation surface A of the lighting device. In case of the lighting device 100 in FIG. 5, it is desirable that the irradiation surface A is concentrated on a road surface, and the irradiation surface A has a rectangular shape to irradiate light over the whole area of the road by using a plurality of lighting devices. In case of the irradiation surface, although n is equal to 4, and a and b are equal to 1 in the superellipse equation, a value of n may be changed according an area of the irradiation surface.

A lens design using the superellipse equation will be described with reference to FIGS. 6 to 11.

Figure 6:
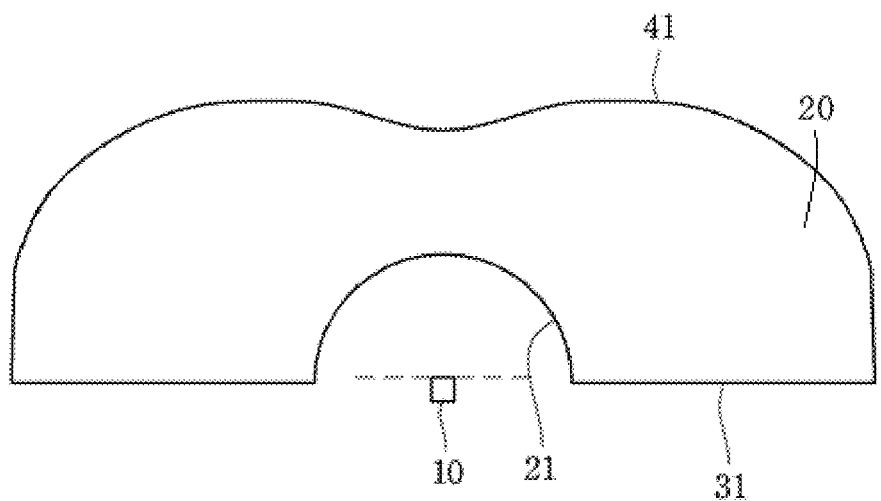
FIG. 6 is a view illustrating an example of a shape of a lens designed according to an embodiment.
Figure 7:
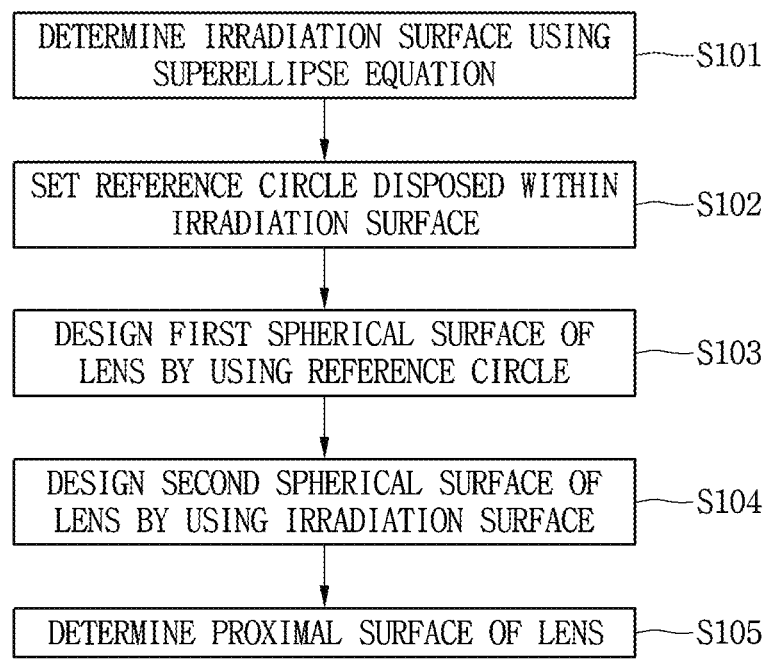
FIG. 7 is a flowchart explaining a method for designing a lens according to an embodiment.

FIG. 6 is a view illustrating an example of a shape of a lens 20 designed according to an embodiment, and FIG. 7 is a flowchart explaining a method for designing a lens 20 according to an embodiment.

Figure 8:
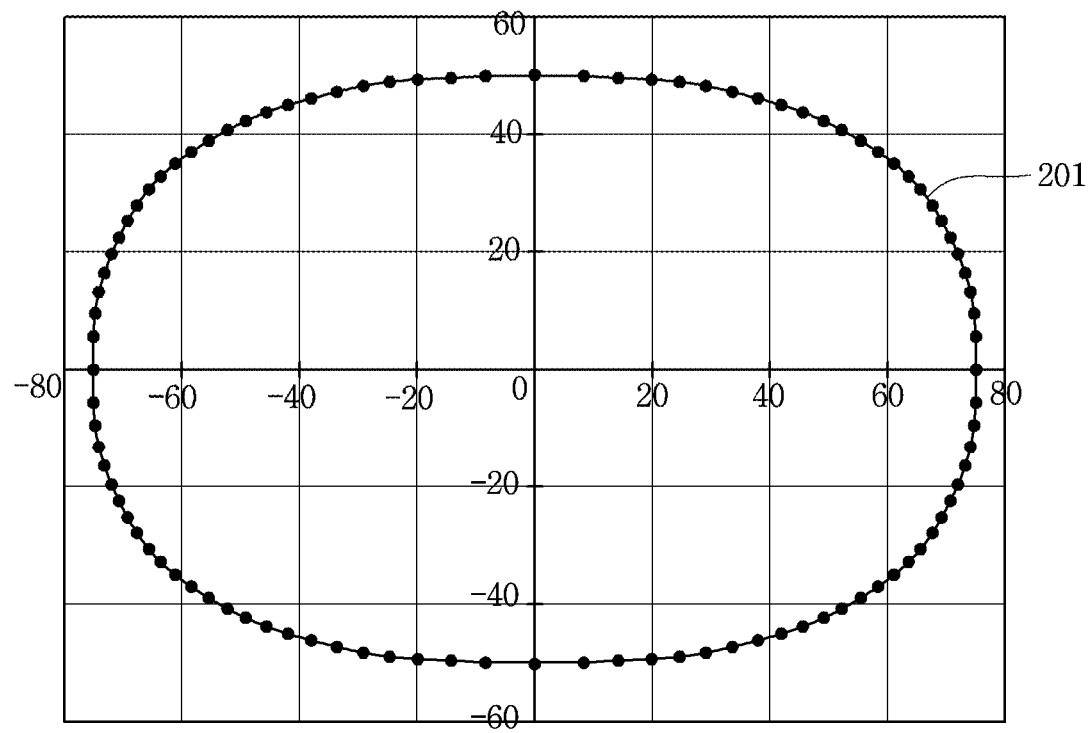
FIG. 8 is a graph illustrating a determined irradiation surface of a lighting device according to an embodiment.
Figure 9:
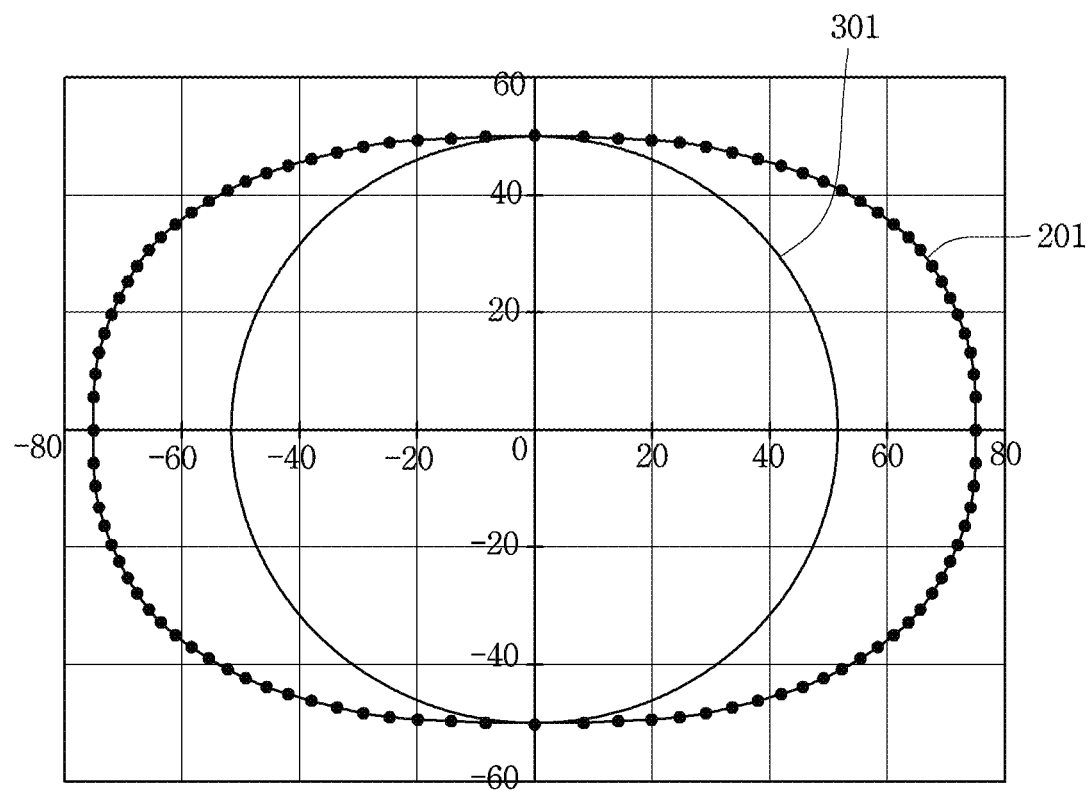
FIG. 9 is a graph illustrating a case in which a reference circle is formed within an irradiation surface to design a first spherical surface of a lens according to an embodiment.
Figure 10:
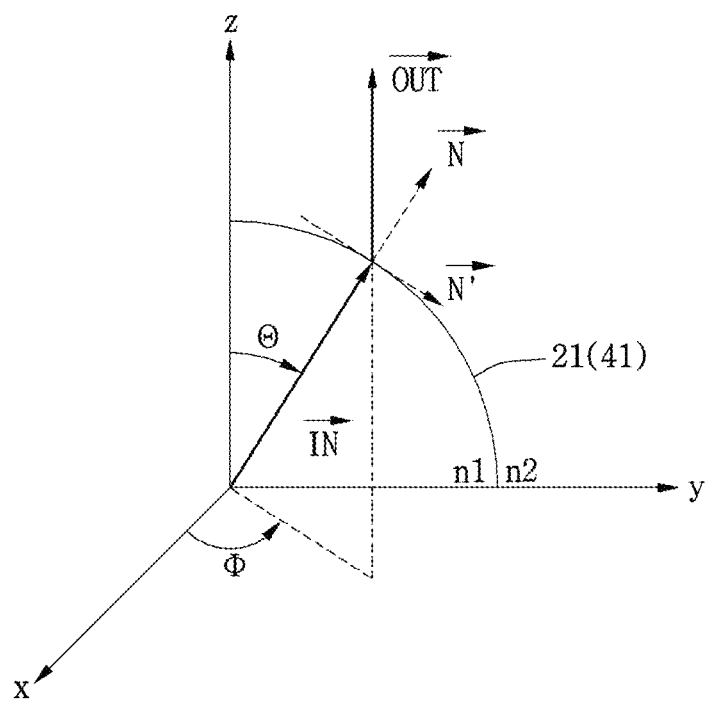
FIG. 10 is a graph illustrating a method for determining first and second spherical surfaces of a lens by using a reference circle and an irradiation surface according to an embodiment.
Figure 11:
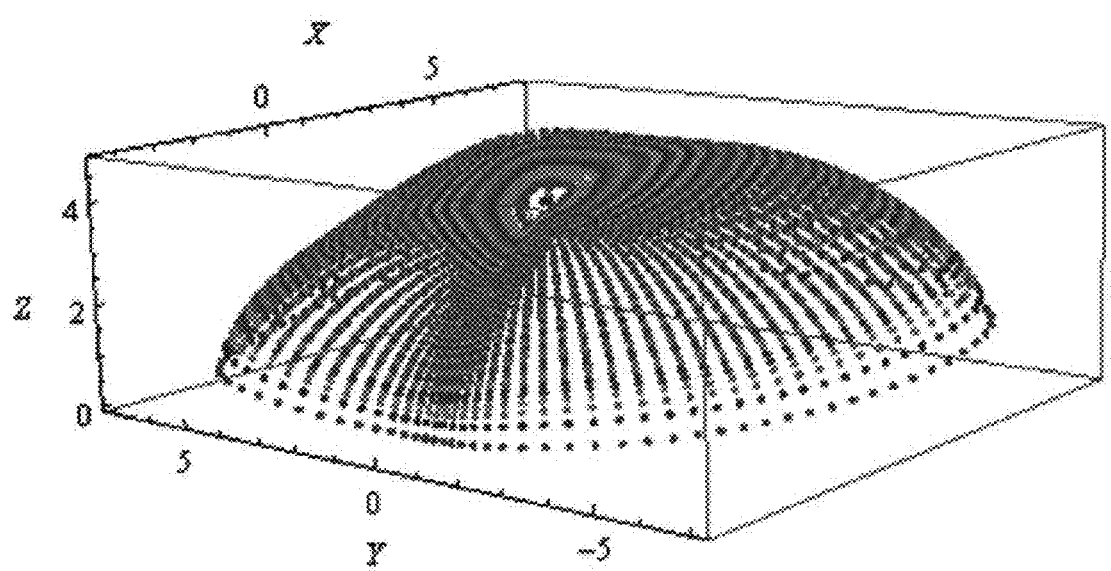
FIG. 11 is a graph illustrating an example of a second spherical surface designed according to an embodiment.

FIG. 8 is a graph illustrating a determined irradiation surface of a lighting device 100 according to an embodiment, FIG. 9 is a graph illustrating a case in which a reference circle is formed within an irradiation surface to design a first spherical surface of a lens according to an embodiment, FIG. 10 is a graph illustrating a method for determining first and second spherical surfaces of a lens by using a reference circle and an irradiation surface according to an embodiment, and FIG. 11 is a graph illustrating an example of a second spherical surface designed according to an embodiment.

Referring to FIG. 6 first, a lens 20 that is an object to be designed includes a first spherical (curved) surface 21 having a shape surrounding an LED device 10 that is a light source and spaced a predetermined distance from the LED device 10, a second spherical (curved) surface 41 defining an outer appearance of the lens and refracting light to an irradiation surface, and a proximal surface 31 connecting ends of the first spherical surface 21 and the second spherical surface 41 to each other.

The lens 20 of the lighting device 100 allows light emitted from the LED device 10 to be refracted by the first spherical surface 21 and refracted by the second spherical surface 41, thereby finally advancing to the irradiation surface. Thus, a design of a free curved surface of the first and second spherical surfaces 21 and 41 has to consider a desired irradiation surface.

Although the irradiation surface onto which light refracted by the second spherical surface 41 is irradiated is determined first by using the superellipse equation, the design of the free curved surface of the lens 20 may be performed first on the first spherical surface 21, and then on the second spherical surface.

Referring to the flowchart of FIG. 7, an irradiation surface onto which light is irradiated lastly is determined by using the superellipse equation to design the lens (S101). As a result, as illustrated in FIG. 8, an irradiation surface surrounded by an outline expressed as a reference numeral 201 may be determined. Alternatively, n, a, and b values in the superellipse equation may be adjusted to determine an irradiation surface having a different shape.

Then, a process of setting a reference circle (see reference numeral 301 in FIG. 9) disposed in the outline 201 of the determined irradiation surface is performed (S102). Here, the reference circle 301 is used to determine a first spherical surface 21 of the lens 20 and has a size that is sufficient to be disposed within the irradiation surface in which the reference circle is determined. The reference circle 301 may have a shape that contacts at least one point of the outline 201 of the irradiation surface. For example, when the irradiation surface has a rectangular shape, the reference circle 301 may be a circle that is inscribed in two points of the outline of the irradiation surface.

The reference circle 301 may be disposed within the irradiation surface. Thus, light refracted by the first spherical surface 21 may be induced to be expanded toward the irradiation surface when the light is refracted by the second spherical surface 41. In this method, a loss of light when the light is refracted by each of the first and second spherical surfaces 21, 41 may be reduced.

Then, a process of designing the first spherical surface 21 of the lens 20 by using coordinates within the determined reference circle 301 (S103). When Snell's law on a refraction surface is calculated by using a direction vector, a normal vector may be calculated. Here, when points of the normal vectors are connected to each other, the required spherical surface may be designed.

Since this calculation process is applied when the first and second spherical surfaces 21, 41 are designed, the process of calculating the normal vector and the point of the normal vector to design the first spherical design will be described with reference to FIG. 10.

$$\vec{N} = \frac{n_2\overrightarrow{\text{Out}} - n_1\overrightarrow{\text{In}}}{|n_2\overrightarrow{\text{Out}} - n_1\overrightarrow{\text{In}}|}$$

[Mathematical Equation 2]

Mathematical Equation 2 above is Snell's law, which is used herein for designing free curved surfaces of the first and second spherical surfaces 21, 41 according to an embodiment.

Here, $\vec{N}$ is a normal vector having a unit size of 1, $\overrightarrow{\text{Out}}$ is a direction vector of light emitted and refracted by the first or second spherical surfaces 21, 41, and $\overrightarrow{\text{In}}$ is a direction vector of light incident to the first or second spherical surfaces 21, 41. Also, n1 is a refractive index of a material through which incident light passes, and n2 is a refractive index of a material through which emission light passes.

A method for designing the first spherical surface 21 spaced a predetermined distance from an LED device with an air layer therebetween will be described. The light emitted from the LED device 10 may be represented by the vector $\overrightarrow{\text{In}}$. Also, since information with respect to the vector $\overrightarrow{\text{In}}$ is determined as a manufacturing specification of LED device 10, the direction vectors of light emitted from the LED device used for the design are set to the vector $\overrightarrow{\text{In}}$.

Also, n1 is equal to 1 because the n1 is the air layer, and n2 represents a refractive index of a material used for a lens 20.

To calculate the normal vector $\vec{N}$ having the unit size, the information with respect to the direction vector of the emission light refracted by the first spherical surface 21 has to be achieved. Here, the direction vector $\overrightarrow{\text{Out}}$ of the emission light is a direction vector of x and y coordinates in the predetermined reference circle 301.

Thus, all the variables in Mathematical Equation 2 for calculating the normal vector $\vec{N}$ may be determined. That is, the normal vectors $\vec{N}$ may be calculated with respect to each of the direction vectors $\overrightarrow{\text{Out}}$ of the light emitted and refracted to the reference circle 301, and the first spherical surface 21 of the lens 20 may be designed by connecting points of the normal vector $\vec{N}$.

Then, a process of designing a free curved surface of the second spherical surface 41 is performed (S104). The above-described Mathematical Equation 2 is used to design the free curved surface of the second spherical surface 41. Here, the vector $\overrightarrow{\text{Out}}$ used to design the first spherical surface is a direction vector $\overrightarrow{\text{In}}$ of the incident light when Snell's law is used to design the second spherical surface 41.

Here, the direction vector $\overrightarrow{\text{Out}}$ of the emission light refracted and emitted by the second spherical surface 41 is a direction vector with respect to the coordinates of the predetermined irradiation surface.

Thus, in the design of the free curved surface of the second spherical surface 41, n1 is a refractive index of a material forming the lens 20, and n2 is a refractive index 1 of the air layer. After the design of the free curved surface for the first spherical surface 21 is completed, all the values n1, n2, $\overrightarrow{\text{In}}$, and $\overrightarrow{\text{Out}}$ required for calculating the normal vector $\vec{N}$ may be determined when the free curved surface for the second spherical surface 41 is designed. Thus, the normal vector $\vec{N}$ may be determined with respect to the direction vector $\overrightarrow{\text{Out}}$ of the emission light refracted and emitted by the second spherical surface 41, and the design of the second spherical surface 41 may be completed by connecting the points of the normal vector $\vec{N}$.

Then, a proximal surface 31 disposed parallel to a light emitting surface of the LED device 10 connects ends of the first and second curved surfaces 21 and 41 to each other on the basis of a processing degree of a material forming the lens 20 (S105).

In this method, the free curved surface indicating start points of the normal vectors may be formed as illustrated in FIG. 11.

As described above, according to the method for designing the lens 20, since the irradiation surface is first determined, and then the lens 20 is designed by using the coordinates that are defined within the determined irradiation surface, various lenses may be easily designed.

Also, since the lens 20 is designed on the basis of the determined irradiation surface, the loss with respect to the light distribution direction or area may be reduced.

Furthermore, since the superellipse equation is used to determine the irradiation surface, the irradiation surface may be easily determined, and the direction vector of the coordinates defined within the irradiation surface may be easily calculated.

In the method according to the foregoing embodiment, the lighting device 100 installed in various environments may allow light to be refracted and emitted to a desired irradiation surface. Also, the lens 20 may be designed with reference to the irradiation surface to reduce the loss of the emission light.

Although only particular examples of embodiments are described in detail, it is obvious to a person skilled in the art that many variations and modifications may be implemented within the technical spirit of embodiments and these variations and modifications also fall within the following claims.

What is claimed is:

1. A method for designing a lens of a lighting device, the lens having a first curved surface for refracting light generated from a light source and a second curved surface for refracting the light having passed through the first curved surface, the method comprising:
   determining an irradiation surface that is an area onto which light having passes through the second curved surface is to be irradiated;
   forming a reference circle disposed within the irradiation surface;
   designing a free curved surface of the first curved surface by using light emitted from the light source as an input direction vector and a coordinate within the reference circle as an output direction vector to calculate normal vectors of the first curved surface; and
   designing a free curved surface of the second curved surface by using light refracted by the first curved surface as an input direction vector and a coordinate within the irradiation surface as an output direction vector to calculate normal vectors of the second curved surface.

2. The method according to claim 1, wherein the determining of the irradiation surface comprises determining the irradiation surface having a curved shape calculated by using the following Mathematical Equation 1:

$$\left|\frac{x}{a}\right|^n + \left|\frac{y}{b}\right|^n = 1 \quad \text{[Mathematical Equation 1]}$$

where n, a, and b are positive numbers, and x and y satisfy the following range: $-a \leq x \leq +a$, $-b \leq y \leq +b$.

3. The method according to claim 2, wherein the irradiation surface comprises various curved shapes according to values of variables n, a, b, x and y of Mathematical Equation 1.

4. The method according to claim 1, wherein the designing of the free curved surface of the first curved surface uses the following Mathematical Equation 2:

$$\vec{N} = \frac{n_2 \vec{Out} - n_1 \vec{In}}{|n_2 \vec{Out} - n_1 \vec{In}|} \quad \text{[Mathematical Equation 2]}$$

where the input direction vector $\vec{In}$ is a direction vector of light emitted from the light source, and the output direction vector $\vec{Out}$ is a direction vector of x and y coordinates disposed within the reference circle.

5. The method according to claim 1, wherein the designing of the free curved surface of the second curved surface uses the following Mathematical Equation 2:

$$\vec{N} = \frac{n_2 \vec{Out} - n_1 \vec{In}}{|n_2 \vec{Out} - n_1 \vec{In}|} \quad \text{[Mathematical Equation 2]}$$

where the input direction vector $\vec{In}$ is a direction vector of x and y coordinates disposed within the reference circle, and the output direction vector $\vec{Out}$ is a direction vector of x and y coordinates disposed within the irradiation surface.

6. The method according to claim 1, further comprising connecting ends of the first curved surface and the second curved surface to each other.

7. The method according to claim 1, wherein the determining of the irradiation surface comprises determining the irradiation surface having a curved shape calculated by using the following Mathematical Equation 1:

$$\left|\frac{x}{a}\right|^n + \left|\frac{y}{b}\right|^n = 1 \quad \text{[Mathematical Equation 1]}$$

where n, a, and b are positive numbers, and x and y satisfy the following range: $-a \leq x \leq +a$, $-b \leq y \leq +b$, wherein the designing of the free curved surface of the first curved surface uses the following Mathematical Equation 2:

$$\vec{N} = \frac{n_2 \vec{Out} - n_1 \vec{In}}{|n_2 \vec{Out} - n_1 \vec{In}|} \quad \text{[Mathematical Equation 2]}$$

where the input direction vector $\vec{In}$ is a direction vector of light emitted from the light source, and the output direction vector $\vec{Out}$ is a direction vector of x and y coordinates disposed within the reference circle, and wherein the designing of the free curved surface of the second curved surface uses the Mathematical Equation 2, where the input direction vector $\vec{In}$ is a direction vector of x and y coordinates disposed within the reference circle, and the output direction vector $\vec{Out}$ is a direction vector of x and y coordinates disposed within the irradiation surface.

8. A method for producing a streetlight, the method comprising:

providing an LED device as a light source; and providing a lens to distribute light of the light source to an irradiation surface, the lens having a first curved surface for refracting the light of the light source and a second curved surface for refracting the light having passed through the first curved surface, the providing a lens including:

determining the irradiation surface that is an area onto which light having passes through the second curved surface is to be irradiated;

forming a reference circle disposed within the irradiation surface;

designing a free curved surface of the first curved surface by using light emitted from the light source as an input direction vector and a coordinate within the reference circle as an output direction vector to calculate normal vectors of the first curved surface; and designing a free curved surface of the second curved surface by using light refracted by the first curved surface as an input direction vector and a coordinate within the irradiation surface as an output direction vector to calculate normal vectors of the second curved surface.

9. The method according to claim 8, wherein the determining of the irradiation surface comprises determining the irradiation surface having a curved shape calculated by using the following Mathematical Equation 1:

$$\left|\frac{x}{a}\right|^n + \left|\frac{y}{b}\right|^n = 1 \quad \text{[Mathematical Equation 1]}$$

where n, a, and b are positive numbers, and x and y satisfy the following range: $-a \leq x \leq +a$, $-b \leq y \leq +b$.

10. The method according to claim 9, wherein the designing of the free curved surface of the first curved surface uses the following Mathematical Equation 2:

$$\vec{N} = \frac{n_2 \vec{Out} - n_1 \vec{In}}{|n_2 \vec{Out} - n_1 \vec{In}|} \quad \text{[Mathematical Equation 2]}$$

where the input direction vector $\vec{In}$ is a direction vector of light emitted from the light source, and the output direction vector $\vec{Out}$ is a direction vector of x and y coordinates disposed within the reference circle.

11. The method according to claim 10, wherein the designing of the free curved surface of the second curved surface uses the Mathematical Equation 2, where the input direction vector $\vec{In}$ is a direction vector of x and y coordinates disposed within the reference circle, and the output direction vector $\vec{Out}$ is a direction vector of x and y coordinates disposed within the irradiation surface.

12. The method according to claim 8, wherein the designing of the free curved surface of the first curved surface uses the following Mathematical Equation 2:

$$\vec{N} = \frac{n_2\vec{Out} - n_1\vec{In}}{|n_2\vec{Out} - n_1\vec{In}|} \qquad \text{[Mathematical Equation 2]}$$

where the input direction vector $\vec{In}$ is a direction vector of light emitted from the light source, and the output direction vector $\vec{Out}$ is a direction vector of x and y coordinates disposed within the reference circle.

13. The method according to claim 8, wherein the designing of the free curved surface of the second curved surface uses the following Mathematical Equation 2:

$$\vec{N} = \frac{n_2\vec{Out} - n_1\vec{In}}{|n_2\vec{Out} - n_1\vec{In}|} \qquad \text{[Mathematical Equation 2]}$$

where the input direction vector $\vec{In}$ is a direction vector of x and y coordinates disposed within the reference circle, and the output direction vector $\vec{Out}$ is a direction vector of x and y coordinates disposed within the irradiation surface.

* * * * *